(12) United States Patent
Trezza

(10) Patent No.: US 7,803,693 B2
(45) Date of Patent: Sep. 28, 2010

(54) BOWED WAFER HYBRIDIZATION COMPENSATION

(76) Inventor: John Trezza, 12 White Oak Dr., Nashua, NH (US) 03063

( * ) Notice: Subject to any disclaimer, the term of this patent is extended or adjusted under 35 U.S.C. 154(b) by 0 days.

(21) Appl. No.: 11/675,453

(22) Filed: Feb. 15, 2007

(65) Prior Publication Data

US 2008/0197488 A1 Aug. 21, 2008

(51) Int. Cl.
*H01L 21/76* (2006.01)
*H01L 21/44* (2006.01)
*H01L 21/311* (2006.01)
*H01L 21/31* (2006.01)

(52) U.S. Cl. ............... 438/457; 438/611; 438/697; 438/759; 438/760; 257/E21.583; 257/E21.586; 257/E21.587

(58) Field of Classification Search ......... 438/697–699, 438/457, 611, 759–760; 257/E21.583, E21.586, 257/E21.587
See application file for complete search history.

(56) References Cited

U.S. PATENT DOCUMENTS

| | | | |
|---|---|---|---|
| 5,435,482 A | 7/1995 | Variot et al. | |
| 5,587,119 A | 12/1996 | White | |
| 5,708,569 A | 1/1998 | Howard et al. | |
| 5,814,889 A | 9/1998 | Gaul | |
| 5,940,729 A | 8/1999 | Downes et al. | |
| 5,962,922 A | 10/1999 | Wang | |
| 6,031,382 A * | 2/2000 | Nakaizumi | 324/754 |
| 6,037,665 A | 3/2000 | Miyazaki | |
| 6,181,569 B1 | 1/2001 | Chakravorty | |
| 6,220,499 B1 * | 4/2001 | Brofman et al. | 228/180.22 |
| 6,314,013 B1 | 11/2001 | Ahn et al. | |
| 6,316,737 B1 | 11/2001 | Evans et al. | |
| 6,559,045 B2 * | 5/2003 | Chung | 438/622 |
| 6,559,540 B2 | 5/2003 | Kawashima | |
| 6,577,013 B1 | 6/2003 | Glenn et al. | |
| 6,599,778 B2 | 7/2003 | Pogge et al. | |
| 6,706,554 B2 | 3/2004 | Ogura | |
| 6,740,576 B1 | 5/2004 | Lin et al. | |

(Continued)

FOREIGN PATENT DOCUMENTS

EP 0 516 866 12/1992

(Continued)

OTHER PUBLICATIONS

"Wafer", Dictionary of Communications Technology: Terms, Defintions, and Abbreviations, Wiley, 1998.*

(Continued)

*Primary Examiner*—Hsien-ming Lee
*Assistant Examiner*—Kevin Parendo

(57) ABSTRACT

A planarizing method performed on a non-planar wafer involves forming electrically conductive posts extending through a removable material, each of the posts having a length such that a top of each post is located above a plane defining a point of maximum deviation for the wafer, concurrently smoothing the material and posts so as to form a substantially planar surface, and removing the material. An apparatus includes a non planar wafer having contacts thereon, the wafer having a deviation from planar by an amount that is greater than a height of at least one contact on the wafer, and a set of electrically conductive posts extending away from a surface of the wafer, the posts each having a distal end, the distal ends of the posts collectively defining a substantially flat plane.

22 Claims, 5 Drawing Sheets

U.S. PATENT DOCUMENTS

| | | |
|---|---|---|
| 6,750,549 B1 | 6/2004 | Chandran et al. |
| 6,939,789 B2 | 9/2005 | Huang et al. |
| 7,157,310 B2 | 1/2007 | Benson et al. |
| 2001/0001292 A1 | 5/2001 | Bertin et al. |
| 2001/0033509 A1 | 10/2001 | Ahn et al. |
| 2001/0048166 A1 | 12/2001 | Miyazaki |
| 2002/0053726 A1 | 5/2002 | Mikubo et al. |
| 2003/0047799 A1 | 3/2003 | Cheever et al. |
| 2004/0126927 A1* | 7/2004 | Lin et al. ............... 438/107 |
| 2004/0207061 A1 | 10/2004 | Farrar et al. |
| 2004/0222510 A1 | 11/2004 | Aoyagi |
| 2004/0262635 A1 | 12/2004 | Lee |
| 2005/0026413 A1 | 2/2005 | Lee et al. |
| 2005/0104027 A1 | 5/2005 | Lazarev |
| 2005/0104219 A1 | 5/2005 | Matsui |
| 2005/0121768 A1 | 6/2005 | Edelstein et al. |
| 2005/0146049 A1 | 7/2005 | Kripesh et al. |
| 2006/0022690 A1* | 2/2006 | Malantonio et al. ........ 324/754 |
| 2006/0038228 A1* | 2/2006 | Aitken et al. ............... 257/347 |
| 2006/0073701 A1* | 4/2006 | Koizumi et al. ............ 438/666 |
| 2006/0211235 A1* | 9/2006 | Usami ....................... 438/618 |

FOREIGN PATENT DOCUMENTS

| | | |
|---|---|---|
| EP | 1 415 950 | 5/2004 |
| EP | 1469512 | 10/2004 |
| JP | 09-246324 | 9/1997 |

OTHER PUBLICATIONS

International Search Report for PCT/US06/23364, dated Nov. 13, 2006.

Topol, A.W. et al., "Enabling Technologies for Wafer-Level Bonding of 3D MEMS and Integrated Circuit Structures", Electronic Components and Technology Conference, 2004, vol. 1, Jun. 1-4, 2004, pp. 931-938.

International Search Report, PCT/US06/23361, dated Sep. 19, 2007.

The International Search Report and Written Opinion for PCT/US2008/053991 mailed on Jul. 7, 2008.

International Preliminary Report on Patentability for PCT/US2008/053991 issued Aug. 19, 2009.

* cited by examiner

BOWED WAFER HYBRIDIZATION COMPENSATION

FIELD OF THE INVENTION

The present invention relates to wafer processing and, more particularly, to wafer processing for electrical connections.

BACKGROUND

Semiconductor wafers are typically highly polished with very smooth surfaces (i.e. deviations of less than 1 nm). However, they are not necessarily uniformly flat across the extent of the wafer. The same is true for wafers of ceramic or other materials. Flatness variation, called "wafer bow," may be a result of the wafer manufacturing process itself or processing of the wafer (e.g. through depositing of metal or dielectric onto the wafer) and can be on the order of 25 μm or more on the concave and/or convex side. If the polished side is concave, the wafer is often referred to as "dished" whereas if it is convex the wafer is called "bowed." Note however, that an individual wafer can concurrently have both types of non-planarities (i.e. one portion is bowed whereas another portion is dished.

For simplicity herein, the terms "dished," "bowed" and "non-planar" are interchangeably used herein to generically refer to a non-flat wafer of, for example, semiconductor or ceramic, irrespective of whether it would formally be called dished or bowed. FIG. 1 illustrates, in simplified form, a conventional non-planar wafer 100. As shown, the wafer 100 is between 500 μm and 750 μm thick and has a maximum deviation "δ" at the edges of 25 μm from flat. As a result, in the example of FIG. 1, the deviation from highest to lowest point across both sides is 40 μm. In most cases, with conventional processes for forming chips and interconnecting them to other chips, this amount of bow is sufficiently small relative to the size of typical connections that it can be disregarded. However, such variations can render a wafer unsuitable for use where the pitch and/or height of the individual contacts is less than or equal to 25 μm, unless further expensive polishing operations are performed to reduce the bow to an acceptable level, if it is possible to do so at all. Moreover, if the same types of connections will be used but the chip will be stacked with another chip, the bowing would be on the order of about 50 μm (i.e. taking into account the maximum deviation of 25 μm each for both chips and/or on both sides).

Thus, there is a need for a way to make use of individual wafers that have bow on a side with contacts that are less in height than the bow or on a pitch where such bow could make it impossible to connect to them.

SUMMARY OF THE INVENTION

We have devised a way to overcome the above problem, rendering wafers that are bowed by up to 20 μm each suitable for use with small pitch and/or height contacts and suitable for stacking despite their bowed nature.

One aspect of the invention involves a planarizing method performed on a non-planar wafer. The method involves forming electrically conductive posts extending through a removable material, each of the posts having a length such that a top of each post is located above a plane defining a point of maximum deviation for the wafer, concurrently smoothing the material and posts so as to form a substantially planar surface, and removing the material.

Another aspect of the invention involves an apparatus. The apparatus includes a non planar wafer having contacts thereon. The wafer has a deviation from planar by an amount that is greater than a height of at least one contact on the wafer. A set of electrically conductive posts extends away from a surface of the wafer. The distal ends of the posts collectively define a substantially flat plane.

Through use of the approaches described herein, bowed wafers can be used with various techniques that allow for via densities, pitch and placement and involve forming small, deep vias in, and electrical contacts for, the wafers—on a chip, die or wafer scale, even though the heights or densities of the contacts thereon are small relative to wafer bow.

The advantages and features described herein are a few of the many advantages and features available from representative embodiments and are presented only to assist in understanding the invention. It should be understood that they are not to be considered limitations on the invention as defined by the claims, or limitations on equivalents to the claims. For instance, some of these advantages are mutually contradictory, in that they cannot be simultaneously present in a single embodiment. Similarly, some advantages are applicable to one aspect of the invention, and inapplicable to others. Thus, this summary of features and advantages should not be considered dispositive in determining equivalence. Additional features and advantages of the invention will become apparent in the following description, from the drawings, and from the claims.

Note that all of the FIGS. are grossly distorted and out of scale for simplicity of presentation.

DETAILED DESCRIPTION

Figure 1:
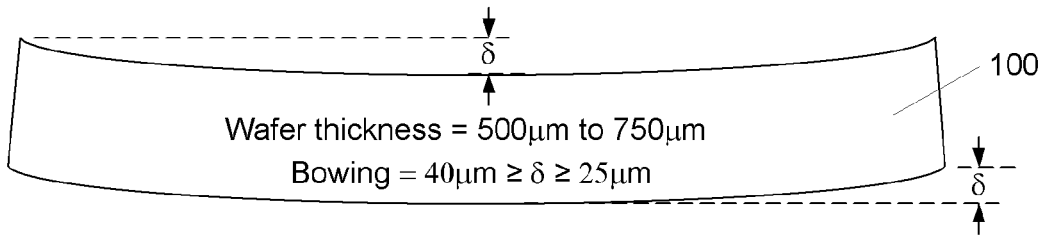
FIG. 1 illustrates, in simplified form, a conventional non-flat wafer.
Figure 2:
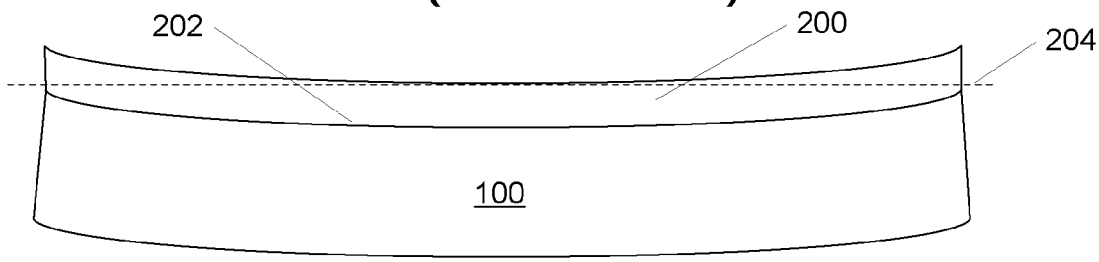
FIGS. 2 through 6 illustrate, in simplified from, use of our approach on a bowed wafer that is considered "dished;"

U.S. patent applications, Ser. Nos. 11/329,481, 11/329,506, 11/329,539, 11/329,540, 11/329,556, 11/329,557, 11/329,558, 11/329,574, 11/329,575, 11/329,576, 11/329,873, 11/329,874, 11/329,875, 11/329,883, 11/329,885, 11/329,886, 11/329,887, 11/329,952, 11/329,953, 11/329,955, 11/330,011 and 11/422,551, incorporated herein by reference, describe various techniques for forming small, deep vias in, and electrical contacts for, semiconductor wafers. The techniques allow for via densities, pitch and placement that was previously unachievable and can be performed on a chip, die or wafer scale. In some cases, it is desirable to perform the techniques described therein on a wafer but the contact heights or densities are small relative to wafer bow. Advantageously, we have developed a way to do so. FIGS. 2 through 6 illustrate, in simplified from, use of our approach on a bowed wafer 100 that is considered "dished." The process is as follows:

First, as shown in FIG. 2, a material 200 is applied to the dished side 202 of the wafer 100 to a thickness that is at least equal to, and typically more than, the maximum deflection δ on that side (as indicated by the dashed line 204).

Depending upon the particular implementation, the material 200 could be a flowable material or fairly solid material. In general, to reduce the number of processing steps, the material will be a photoresist or photosensitive dielectric, so that it can be patterned. Alternatively, a machine-able or moldable material could be used. In the case of a substantially solid material, example suitable materials include photoresists from the Riston® dry film line of photoresist, commercially available from E. I. du Pont de Nemours & Co. Specifically, The Riston® PlateMaster, EtchMaster and TentMaster lines of photoresist are suitable and at, respectively, about 38 μm, 33 μm and 30 μm in thickness, are all more than sufficient o handle the deviations at issue.

In the case of a device bearing wafer, using a material 200 that can be patterned makes it easier to match and create openings over the locations of the contacts or device pads on the wafer 100. In addition, if a substantially solid material 200 is used, the wafer can also contain unfilled vias or features extending into the wafer and there is little to no risk of those vias becoming filled by the material 200—indeed it can protect them from becoming filled by subsequent steps if desired.

Figure 3:
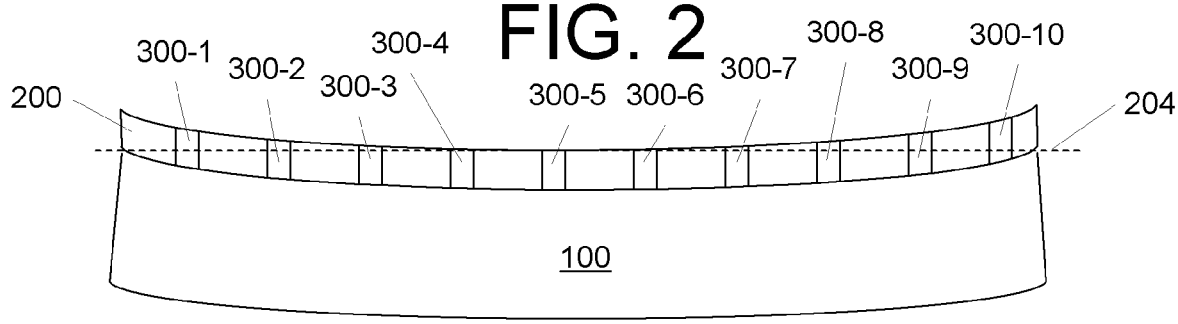

FIG. 3 illustrates, in simplified form, the wafer 100 after the material has been patterned to form openings 300-1, 300-2, 300-3, 300-4, 300-5, 300-6, 300-7, 300-8, 300-9, 300-10 in the wafer over pre-formed connection points.

Figure 4:
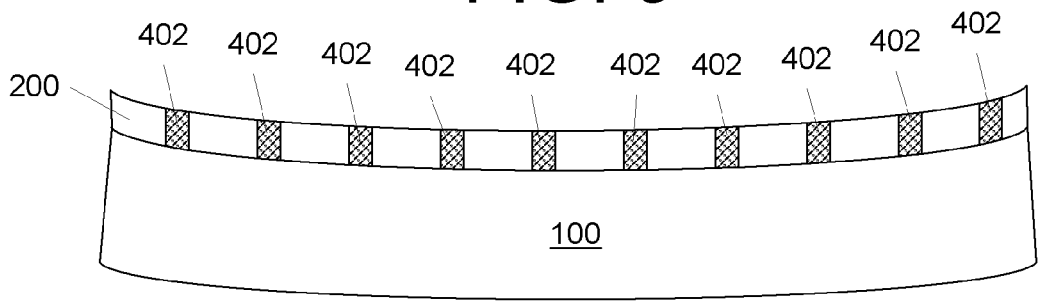

Thereafter, the openings are filled with electrically conductive material, typically a metal, using any suitable process including, for example in the case of metal, deposition or plating (electro- or electroless) or some combination thereof FIG. 4 illustrates, in simplified form, the wafer 100 of FIG. 3 after the openings 300-1, 300-2, 300-3, 300-4, 300-5, 300-6, 300-7, 300-8, 300-9, 300-10 have each been filled with the electrically conductive material 402.

Next, the surface 400 of the wafer 100 is polished smooth using a conventional polishing or other smooth finishing method that will result in as small a deviation as possible, with maximum deviation of less than the contact height, typically from ±0 μm to about 10 μm. However, in some implementations where a post and penetration connection will be used, that approach can allow for greater deviations due to the inherent flexibility that such connections provide.

The approach involves the use of two contacts in combination: a rigid "post" contact and a relatively malleable (with respect to the post material) pad contact, in some cases, either or both having an underlying rigid supporting structure or standoff. In simple overview, one of the two contacts is a rigid material, such as nickel (Ni), copper (Cu) or paladium (Pd) or other suitably rigid alloy such as described herein. This contact serves as the "post." The other of the two contacts is a material that is sufficiently softer than the post that when the two contacts are brought together under pressure (whether from an externally applied force or a force caused, for example, by flexation of the wafer) the post will penetrate the malleable material (the "post and penetration" part) and heated to above a prespecified temperature (the tack phase of the tack and fuse process) the two will become "tacked" together upon cooling to below that temperature without either of them reaching a liquidus state.

Advantageously, the tack and fuse processes are both typically non-liquidus process. This means that the process is done so that the malleable material becomes softened significantly but does not become completely liquidus during either the tack or fuse processes. This is because if the malleable material were to become liquidus, there would be significant risk that the resultant liquid would run and short out adjacent contacts. By keeping the materials non-liquidus, far greater contact density can be achieved.

Figure 5:
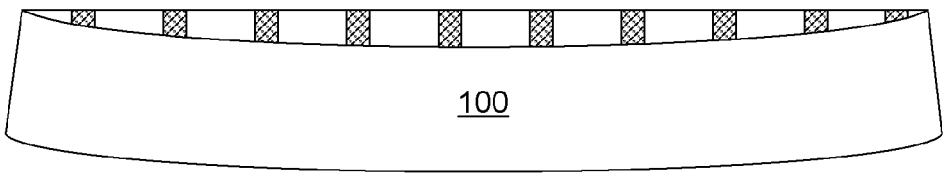

FIG. 5 illustrates, in simplified form, the wafer 100 after the polishing operation has been completed.

Figure 6:
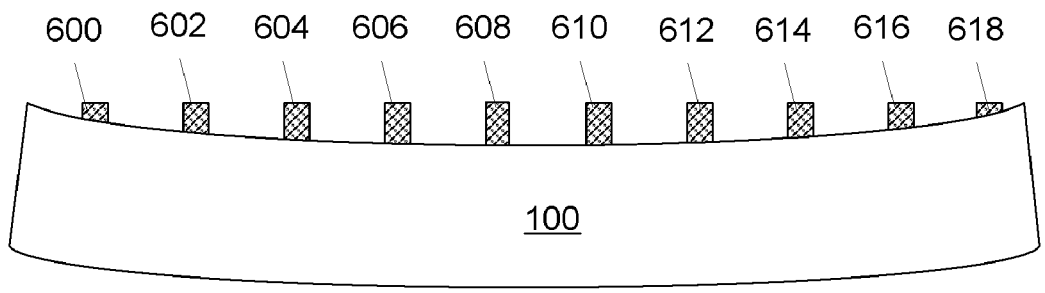

Next, as shown in FIG. 6, after the material 200 has been removed, using a process appropriate to the selected material 200, a series of elevated, conductive "posts" 600, 602, 604 606, 608, 610, 612, 614, 616, 618 will remain and, although the posts 600, 602, 604 606, 608, 610, 612, 614, 616, 618 may be of differing heights, their upper surfaces will be substantially flat (i.e. within the maximum deviation of the polishing or smooth finishing method). As a result, the connection points on the wafer 100 can now be connected to, or another chip, die or wafer can be stacked without encountering the problems of the prior art noted above.

Figure 7:
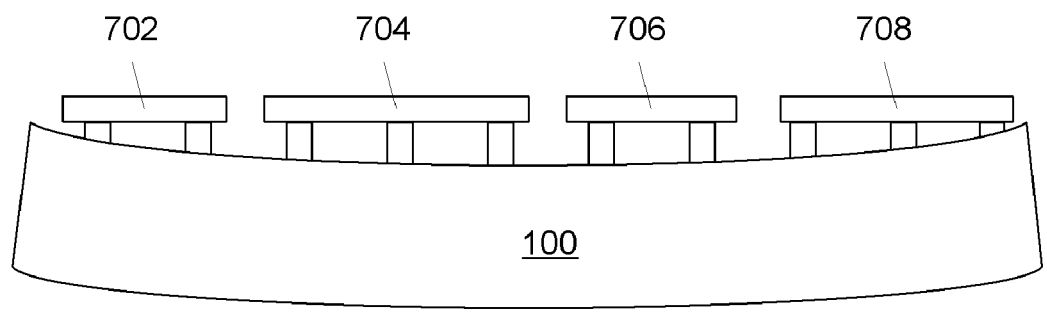
FIG. 7 illustrates, in simplified form, the wafer of FIG. 6 after a set of chips have been connected to it.

FIG. 7 illustrates, in simplified form, the wafer 100 of FIG. 6 after a set of chips 702, 704, 706, 708 have been connected to it using the planarizing posts 600, 602, 604 606, 608, 610, 612, 614, 616, 618 formed using the process.

Figure 8:
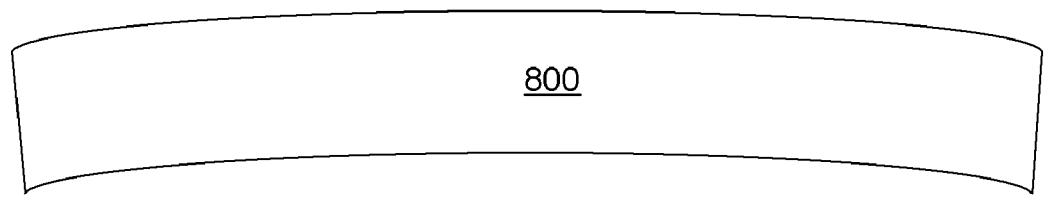
FIG. 8 through FIG. 15 illustrate, in simplified from, use of our approach on a bowed wafer 100 that is considered "bowed;"

FIG. 8 illustrates, in simplified form, a wafer 800 that is considered "bowed."

Figure 9:
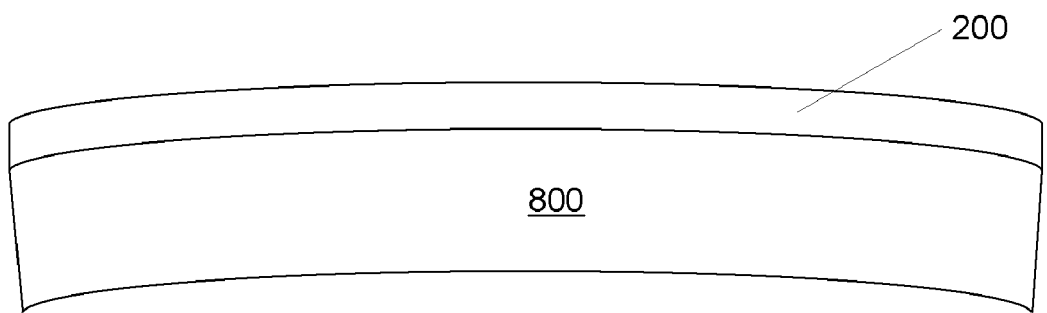

FIG. 9 through FIG. 15 illustrate, in simplified from, use of our approach on the bowed wafer 800 of FIG. 8 "bowed." The process is as follows:

First, as shown in FIG. 9, as with FIG. 2, a material 200 such as described in connection with FIG. 2, is applied to the wafer 800, although, in this case, it is applied to the bowed side 802 of the wafer 100.

Figure 10:
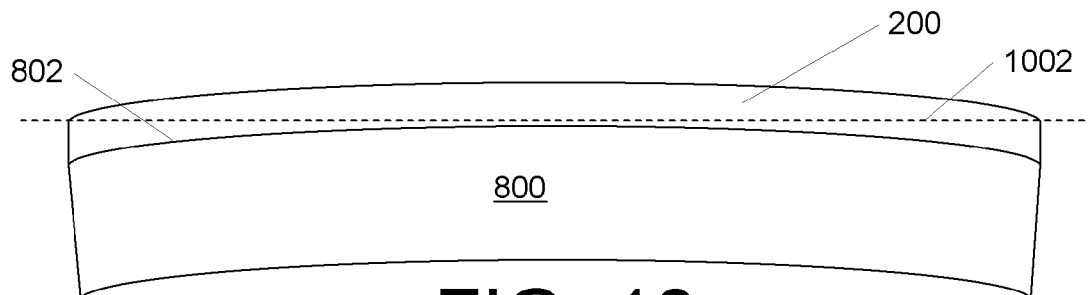

As illustrated in FIG. 10, the material 200 is again applied to a thickness that is at least equal to, and typically more than, the maximum deflection δ on that side (as indicated by the dashed line 1002).

Figure 11:
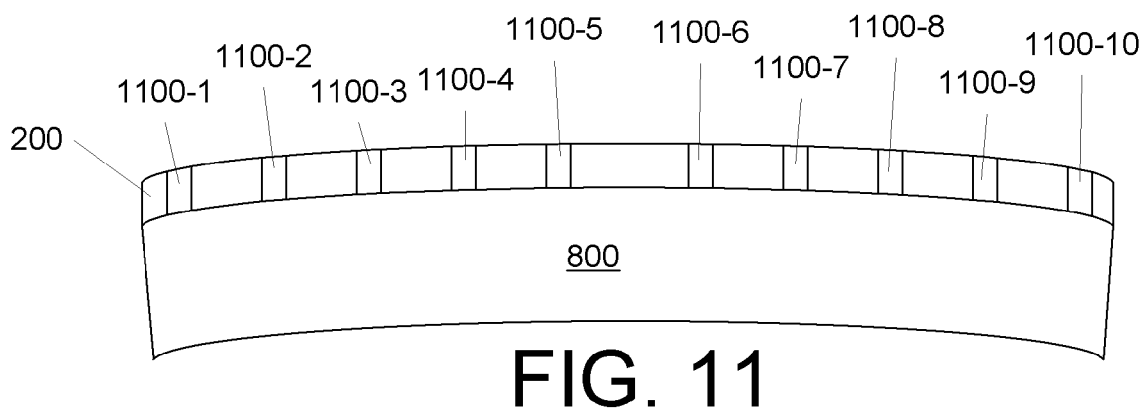

FIG. 11 illustrates, in simplified form, the wafer 800 after the material has been patterned to form openings 1100-1, 1100-2, 1100-3, 1100-4, 1100-5, 1100-6, 1100-7, 1100-8, 1100-9, 1100-10 in the wafer over pre-formed connection points.

Figure 12:
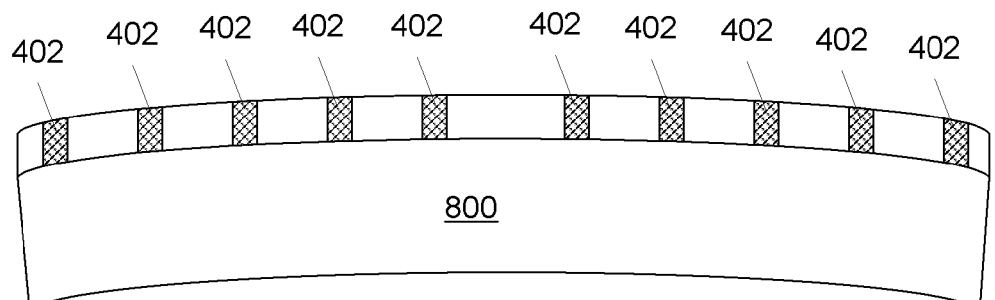

Thereafter, as above, the openings are filled with an electrically conductive material, typically metal, using any suitable process including, for example, deposition or plating (electro- or electroless) or some combination thereof FIG. 12 illustrates, in simplified form, the wafer 800 of FIG. 11 after the openings have been filled.

Figure 13:
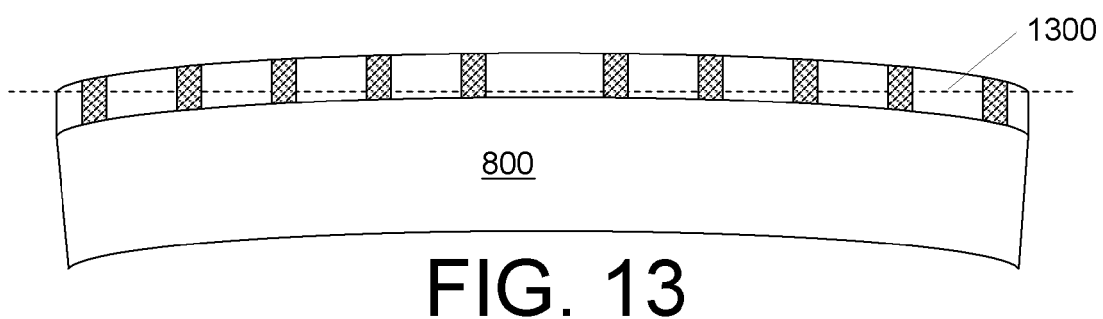

Next, as shown in FIG. 13, the wafer 800 will be polished smooth, in this case down to a level indicated by the dashed line 1300, using a conventional polishing or other smooth finishing method that will result in it being substantially flat (i.e. having a deviation from a commercially creatable "perfectly flat" of between 0 μm and no more than about 10 μm).

Figure 14:
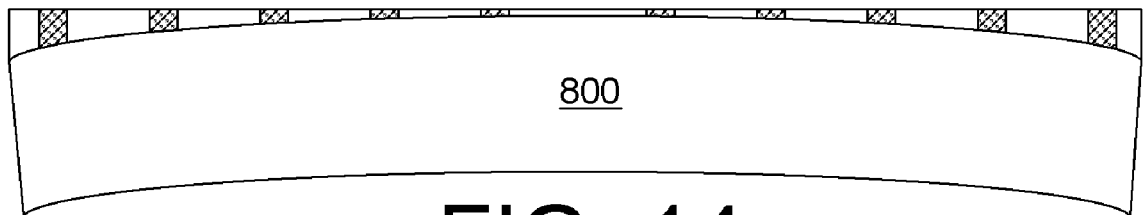

FIG. 14 illustrates, in simplified form, the wafer 800 after the polishing operation has been completed.

Figure 15:
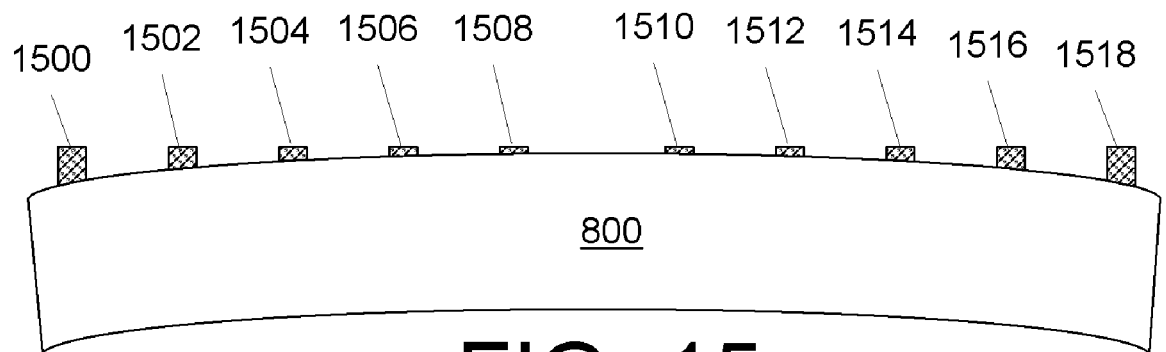

Next, as shown in FIG. 15, after the material 200 has been removed, using a process appropriate to the selected material 200, a series of elevated, electrically conductive "posts" 1500, 1502, 1504 1506, 1508, 1510, 1512, 1514, 1516, 1518 will remain and, although the posts 1500, 1502, 1504 1506, 1508, 1510, 1512, 1514, 1516, 1518 may be of differing heights, their upper surfaces will be substantially planar (within the maximum deviation of the polishing or smooth finishing method). As a result, the connection points on the wafer 800 can now be connected to, or another chip, die or wafer can be stacked without encountering the problems of the prior art noted above.

Figure 16:
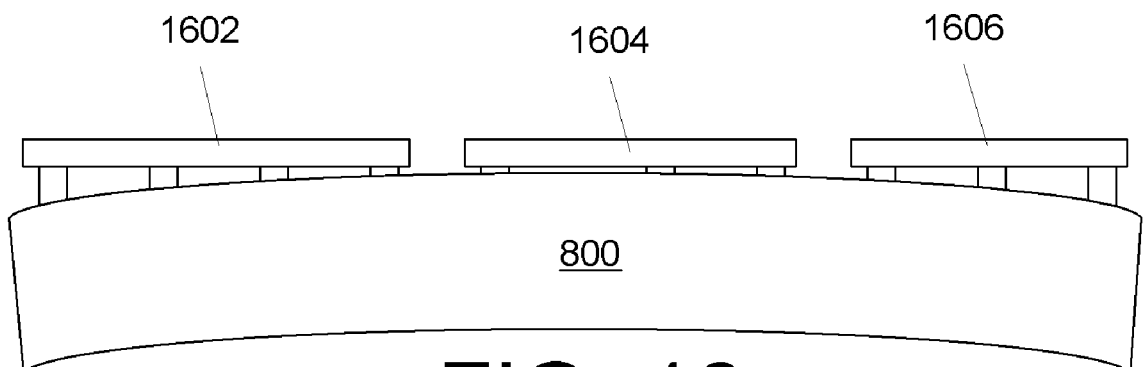
FIG. 16 illustrates, in simplified form, the wafer of FIG. 15 after a set of chips have been connected to it using the planarizing posts formed using the process.

FIG. 16 illustrates, in simplified form, the wafer 800 of FIG. 15 after a set of chips 1602, 1604, 1606 have been connected to it using the planarizing posts 1500, 1502, 1504 1506, 1508, 1510, 1512, 1514, 1516, 1518 formed using the process.

Thus, should now be appreciated that the approaches described above will allow one to readily connect, on a wafer basis, a pair of wafers that are at a maximum bowed deviation irrespective of whether they are dished or bowed in configuration.

Figure 17:
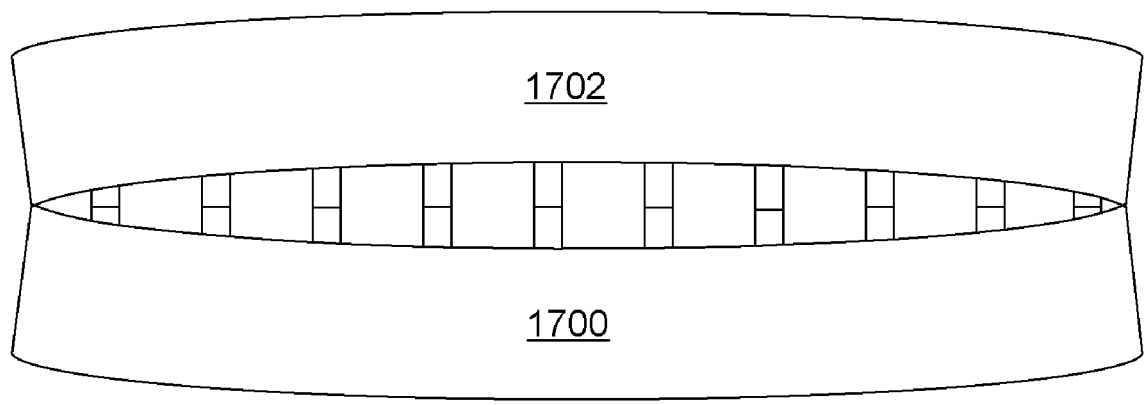
FIG. 17 illustrates, in simplified form, a pair of dished wafers that have been planarized according to the approach described herein and joined to each other.

FIG. 17 illustrates, in simplified form, a pair of dished wafers 1700, 1702 that have been planarized according to the approach described herein and joined to each other.

Figure 18:
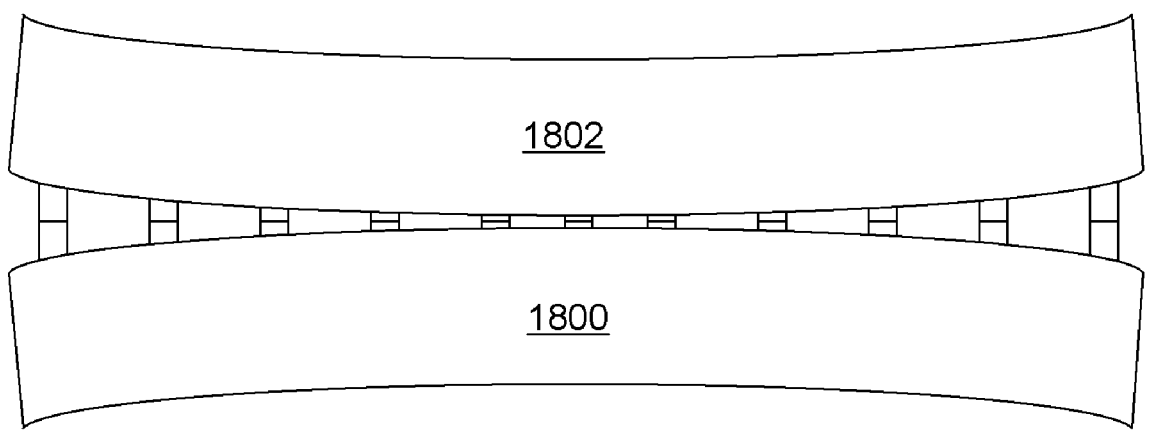
FIG. 18 illustrates, in simplified form, a pair of bowed wafers that have been planarized according to the approach described herein and joined to each other.

FIG. 18 illustrates, in simplified form, a pair of bowed wafers 1700, 1702 that have been planarized according to the approach described herein and joined to each other.

Of course, the same approach could be used to connect a dished to a bowed or a bowed to a dished wafer in the same manner.

It should thus be understood that this description (including the figures) is only representative of some illustrative embodiments. For the convenience of the reader, the above description has focused on a representative sample of all possible embodiments, a sample that teaches the principles of the invention. The description has not attempted to exhaustively enumerate all possible variations. That alternate embodiments may not have been presented for a specific portion of the invention, or that further undescribed alternate embodiments may be available for a portion, is not to be considered a disclaimer of those alternate embodiments. One of ordinary skill will appreciate that many of those undescribed embodiments incorporate the same principles of the invention and others are equivalent.

What is claimed is:

1. A planarizing method performed on a non-planar substrate, wherein the non-planar substrate has a plurality of pre-formed electrical contacts disposed on a side having a non-planar surface, and wherein the non-planar surface has a deviation from planarity and comprises at least one of a bowed portion or a dished portion, the method comprising:
    applying a removable material to the side having the non-planar surface, wherein the removable material has a thickness that is greater than the deviation from planarity;
    forming a plurality of openings in the removable material, wherein the plurality of openings extend through the removable material down to the pre-formed electrical contacts;
    filling the plurality of openings with an electrically-conductive material;
    partially removing both the removable material and the electrically-conductive material, thereby forming an approximately planar surface; and
    removing the removable material such that the electrically-conductive material is exposed and a plurality of posts are formed having distal ends that are approximately coplanar.

2. The method of claim 1, further comprising:
    joining a chip to the non-planar substrate using at least one of the plurality of posts, thereby forming an electrical connection between the non-planar substrate and the chip.

3. The method of claim 2, wherein said joining the chip to the non-planar substrate comprises penetrating at least one of the plurality of posts into a malleable metal at a temperature below a melting temperature of the malleable metal, and wherein the malleable metal is softer than the posts at the temperature.

4. The method of claim 1, further comprising joining a second wafer to the non-planar substrate using at least one of the plurality of posts, thereby forming an electrical connection between the second wafer and the non-planar substrate.

5. The method of claim 1, wherein said applying the removable material to the side having the non-planar surface comprises applying a flowable removable material.

6. The method of claim 1, wherein said applying the removable material to the side having the non-planar surface comprises applying a solid removable material.

7. A planarizing method performed on a non-planar substrate, wherein the non-planar substrate has a plurality of contacts disposed on a side having a non-planar surface, and wherein the non-planar surface comprises at least one of a bowed portion or a dished portion, the method comprising:
    forming a plurality of electrically-conductive posts projecting from pre-formed electrical contacts on the side having the non-planar surface, through a removable material disposed on the side having the non-planar surface, wherein each of the plurality of electrically-conductive posts has a length such that a top of each post is located above a plane defining a point of maximum deviation of the non-planar surface from planarity;
    partially removing the removable material and the plurality of electrically-conductive posts, thereby forming an approximately planar surface; and
    removing the removable material, thereby exposing the plurality of electrically-conductive posts, wherein each of the plurality of electrically-conductive posts projects from a portion of the non-planar surface adjacent to the post.

8. The method of claim 7, further comprising stacking a second substrate onto the non-planar substrate using at least some of the plurality of electrically-conductive posts, thereby forming a plurality of electrical connections between the second substrate and the non-planar substrate.

9. The method of claim 7, further comprising stacking a chip onto the non-planar substrate using at least some of the plurality of electrically-conductive posts, thereby forming electrical connections between the non-planar substrate and the chip.

10. An apparatus, comprising:
    a non-planar substrate having contacts thereon, wherein the non-planar substrate has a non-planar surface that has a deviation from planarity and comprises at least one of a bowed portion or a dished portion; and
    a plurality of electrically-conductive posts, each connected to one of the contacts, wherein the plurality of electrically-conductive posts are formed in a removable material disposed directly on the non-planar substrate, wherein each of the plurality of electrically-conductive posts projects from a portion of the non-planar surface adjacent to the post, wherein the plurality of electrically-conductive posts each have a distal end, and wherein the distal ends of the plurality of electrically-conductive posts collectively define an approximately flat plane;
    wherein the plurality of electrically-conductive posts comprise an electrically-conductive material that is rigid and configured to penetrate into a malleable metal at a temperature below a melting point of the malleable metal, and wherein the malleable metal is softer than the rigid material.

11. The apparatus of claim 10, wherein the plurality of electrically-conductive posts comprise a metal.

12. The apparatus of claim 10, wherein the non-planar substrate comprises a semiconductor wafer.

13. The apparatus of claim 10, wherein the non-planar substrate comprises a ceramic.

14. The apparatus of claim 10, wherein at least one of the plurality of electrically-conductive posts has a length, measured from the distal end to the portion of the non-planar surface adjacent to the post, greater than the deviation from planarity.

15. The apparatus of claim 10, wherein at least one of the plurality of electrically-conductive posts has a length, measured from the distal end to the portion of the non-planar surface adjacent to the post, equal to the deviation from planarity.

16. The method of claim 1, wherein at least some of the plurality of posts have different heights suitable for compensating for the deviation from planarity.

17. The method of claim 1, wherein said partially removing comprises partially removing the removable material and the electrically-conductive material at the same time.

18. The method of claim 7, wherein said partially removing comprises partially removing the removable material and the plurality of electrically-conductive posts substantially simultaneously in a single process.

19. The apparatus of claim 10, wherein at least some of the plurality of posts have different heights suitable for compensating for the deviation from planarity.

20. The method of claim 1, wherein said partially removing comprises polishing the removable material and the electrically-conductive material at the same time.

21. The method of claim 1, wherein said applying the removable material comprises applying the removable material directly to the non-planar substrate on the side having the non-planar surface.

22. The method of claim 7, wherein the non-planar substrate comprises one of a semiconductor or a ceramic material, and wherein the removable material is disposed directly on the non-planar surface of the semiconductor or ceramic material.

* * * * *